United States Patent [19]

Anthony et al.

[11] Patent Number: 4,539,743

[45] Date of Patent: Sep. 10, 1985

[54] PRODUCTION OF SEMICONDUCTOR STRUCTURES WITH BURIED RESISTIVE OR CONDUCTIVE REGIONS BY CONTROLLED ION BOMBARDMENT AND HEAT TREATMENT

[75] Inventors: Philip J. Anthony, Bridgewater; Robert L. Hartman, Warren; Louis A. Koszi, Scotch Plains; Bertram Schwartz, Westfield, all of N.J.

[73] Assignee: AT&T Bell Laboratories, Murray Hill, N.J.

[21] Appl. No.: 555,506

[22] Filed: Nov. 28, 1983

[51] Int. Cl.³ .................. H01L 21/263; H01L 21/26
[52] U.S. Cl. ........................... 29/576 B; 148/1.5; 148/175; 148/187; 357/91; 372/46
[58] Field of Search .............. 148/1.5, 187, 175; 29/576 B; 357/91; 372/46

[56] References Cited

U.S. PATENT DOCUMENTS

| | | | |
|---|---|---|---|
| 3,824,133 | 7/1974 | D'Asaro | 148/1.5 |
| 4,290,825 | 9/1981 | Dearnaley et al. | 148/33.4 |
| 4,358,323 | 9/1982 | Wallace | 148/1.5 |
| 4,378,255 | 3/1983 | Holonyak, Jr. et al. | 148/1.5 |
| 4,391,952 | 5/1983 | Rosen | 148/1.5 |
| 4,394,180 | 7/1983 | Dearnaley et al. | 148/1.5 |
| 4,403,397 | 9/1983 | Bottka et al. | 29/572 |

FOREIGN PATENT DOCUMENTS 53-019778 2/1978 Japan .

OTHER PUBLICATIONS

Blood in Gallium Arsenide . . . 1980 Inst. Phys. Conf. Ser. 56, Ed. Thim, Bristol, p. 251.
Tong-He et al., Rad. Effects, 77 (1983) 97.
Donnelly et al., Nucl. High Methods, 182 (1981), p. 553.
"Deuteron Bombardment of Gallium Arsenide for Device Isolation", *IEEE Electron Dev. Lett.*, vol. EDL-1, No. 5, p. 72 (1980), K. Steeples et al.
"Optical and Electrical Properties of Proton Bombarded P-Type GaAs", *J. Appl. Phys.*, vol 44, No. 1, Jan. 1973, p. 207, J. C. Dyment et al.
"Proton Bombardment in InP", *Solid-State Electronics*, vol. 20, (1977), pp. 727–730, J. P. Donnelly et al.
"The Electrical Characteristics of Ion Implanted Compound Semiconductors", *Nuclear Instruments and Methods*, (1981), pp. 553–571, J. P. Donnelly et al.
"High Resistivity in P-Type InP by Deuteron Bombardment", *Appl. Phys. Lett.*, vol. 42, No. 11, (Jun. 1, 1983), pp. 970–972, M. W. Focht et al.
"Annealing of Defects in Ion Bombarded Indium Antimonide", *Sov. Phys. Semicond.*, vol. 11, No. 7, (Jul. 1977), pp. 798–800, V. A. Bogatyrev et al.
"Electrical Properties of Proton and Helium Ion Bombarded GaAs", *Report on Research Applications* 24(2) (1975), H. Harada, et al.
"Compensation of N-Type GaAs by Proton Bombardment", *Second International Conference Ion Implantation in Semiconductors*, Springer-Verlag, Berlin 1971, pp. 212–221, B. R. Pruniaux et al.

*Primary Examiner*—Upendra Roy
*Attorney, Agent, or Firm*—Michael J. Urbano

[57] ABSTRACT

The property of Group III-V compound materials, whereby ion bombarded material becomes highly resistive but recovers its original low resistivity by annealing at a temperature which is dopant and material dependant, is utilized to fabricate integrated circuits which include buried semiconductor interconnections or bus bars between devices.

11 Claims, 8 Drawing Figures

FIG. 2

| # | Dopant-- | Approx. Concen- tration | Epitaxial Layer Composition | Resis- tivity Ratio | Anneal Temp. °C | Resis- tivity Ratio | Anneal Temp. °C | Resis- tivity Ratio | Anneal Temp. °C | Resis- tivity Ratio | Anneal Temp. °C | Resis- tivity Ratio | Anneal Temp. °C | Resis- tivity Ratio |
|---|---|---|---|---|---|---|---|---|---|---|---|---|---|---|
| 1 | Ge- | $2 \times 10^{17}$ | 40% Aℓ | $>10^4$ | 450 | - | - | $>10^4$ | 575 | $>10^4$ | 600 | $\sim 10^3$ | 650 | $\sim 10^2$ | 700 |
| 2 | Ge- | $4 \times 10^{17}$ | Binary | - | - | - | - | - | - | $\sim 10^2$ | 600 | - | - | $\sim 10^2$ | 700 |
| 3 | Ge- | $4 \times 10^{18}$ | Binary | - | - | - | - | - | - | $\sim 5$ | 600 | $\sim 5$ | 650 | $\sim 5$ | 700 |
| 4 | Mg- | $3 \times 10^{17}$ | 40% Aℓ | $>10^4$ | 450 | $>10^4$ | 550 | - | - | 1 | 600 | - | - | 1 | 700 |
| 5 | Mg- | $1 \times 10^{18}$ | 40% Aℓ | $>10^4$ | 450 | $>10^4$ | 500 | $\sim 10$ | 570 | 1 | 600 | - | - | - | - |
| 6 | Mg- | $1 \times 10^{18}$ | 30% Aℓ | $>10^4$ | 450 | - | - | 1 | 570 | 1 | 600 | - | - | 1 | 700 |
| 7 | Mg- | $1 \times 10^{18}$ | Binary | - | - | - | - | $\sim 5$ | 570 | $\sim 5$ | 600 | - | - | - | - |
| 8 | Mg- | $1 \times 10^{18}$ | 1% Sb | $>10^4$ | 450 | - | - | $\sim 5$ | 570 | - | - | $\sim 5$ | 625 | $\sim 5$ | 700 |
| 9 | Zn- | $>1 \times 10^{18}$ | Binary | $>10^4$ | 450 | - | - | 1 | 570 | - | - | 1 | 650 | - | - |

PRODUCTION OF SEMICONDUCTOR STRUCTURES WITH BURIED RESISTIVE OR CONDUCTIVE REGIONS BY CONTROLLED ION BOMBARDMENT AND HEAT TREATMENT

CROSS REFERENCE TO RELATED APPLICATIONS

This application was concurrently filed with the following applications: M. W. Focht, L. A. Koszi and B. Schwartz Case 2-13-42, Ser. No. 555,670 entitled "Integrated Circuits Employed Proton-Bombarded AlGaAs Layers," and F. Capasso, M. W. Focht, A. T. Macrander and B. Schwartz Case 11-3-2-41, Ser. No. 555,671 entitled "Integrated Circuits Employing Ion-Bombarded InP Layers."

BACKGROUND OF THE INVENTION

This invention relates to Group III-V compound semiconductor structures having juxtaposed high and low resistivity regions and, more particularly, to integrated circuits in which buried interconnections are realized using such structures.

Integrated circuits typically include a plurality of devices (e.g., components or circuits) formed in a single semiconductor wafer. The devices may be electrically isolated from one another by a variety of techniques: p-n junction isolation, etched-groove isolation, or oxide channel isolation, for example. Metallization patterns on the surface of the wafer are used to address selected devices or to interconnect them to one another. Generally speaking, however, the interconnection and/or addressing of devices does not involve buried semiconductor channels to achieve these functions.

SUMMARY OF THE INVENTION

In accordance with our invention, we advantageously exploit the property of Group III-V compound materials which, when subjected to ion bombardment, become highly resistive, but, when subsequently subjected to a controlled heat treatment, may return to low resistivity or may retain high resistivity depending primarily on the annealing temperature, the material composition, and the dopant incorporated therein. These characteristics allow buried semiconductor interconnections and buried semiconductor bus bars to be realized by building into an integrated circuit alternating, differently doped Group III-V compound layers and utilizing ion bombardment and a controlled heat treatment to render selected layers lowly resistive (or conductive) while other layers remain highly resistive. The highly resistive layers can be used to electrically isolate devices from one another or to define the boundaries of low resistivity (or high conductivity) layers used as buried interconnections or bus bars.

BRIEF DESCRIPTION OF THE DRAWING

Our invention, together with its various features and advantages, can be readily understood from the following, more detailed description taken in conjunction with the accompanying drawing, in which:

FIG. 2 is a table showing the ratio of sample resistivity after proton bombardment and annealing to that before bombardment, at the indicated temperatures;

DETAILED DESCRIPTION

Figure 1:
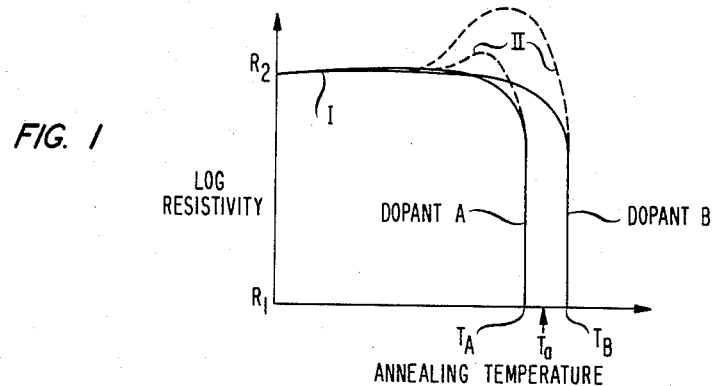
FIG. 1 is a schematic graph of resistivity versus annealing temperature for Group III-V compound samples having essentially identical composition but different dopants.

When Group III-V compounds, such as $Al_xGa_{1-x}As$ ($0 \leq X \leq 1$) and InP, are bombarded with ions, such as protons, deuterons or helium ions, the semiconductor is damaged. Depending upon a number of parameters, such as ion dose, conductivity type, and material composition, the damaged semiconductor may become highly resistive (e.g., $10^5$–$10^9$ ohm-cm). More specifically, the concurrently filed application of M. W. Focht et al (Case 2-13-42), supra, describes the proton bombardment of n-type and p-type GaAs and AlGaAs. FIG. 1 of that application, which is incorporated by reference herein, shows that the peak resistivity for n-type GaAs is approximately $10^9$ ohm-cm, whereas the peak resistivity for p-type GaAs is approximately $10^5$ ohm-cm, nearly four orders of magnitude lower. Second, the peak resistivity for n-type GaAs occurs at a dose of approximately $1 \times 10^{14}/cm^2$, whereas the peak resistivity for p-type GaAs occurs at a dose of about $5 \times 10^{15}/cm^2$. Third, at a dose of $1 \times 10^{14}/cm^2$ p-type GaAs remains highly conductive while n-type GaAs becomes highly resistive. The protons typically penetrate into GaAs to a depth of approximately 1 $\mu$m for each 100 keV, for example. That is, a proton energy of 300 keV produces an approximately Gaussian distribution of protons in the semiconductor with the peak of the distribution occurring at a depth of approximately 3 $\mu$m into the bombarded material. Similarly, proton bombardment at 200 keV would produce a corresponding peak at a depth of about 2 $\mu$m. Accordingly, multiple bombardments at different energies can be performed sequentially in order to produce a more nearly uniform distribution of resistivity.

The general profiles shown in FIG. 1 of the Focht et al application are applicable to other Group III-V compounds containing GaAs (e.g., $Al_xGa_{1-x}As$, $0 \leq X \leq 1$) as well as to a variety of n-type dopants (e.g., Sn, Te), p-type dopants (e.g., Zn, Ge), and a range of dopant concentrations. But, in the latter instance, higher donor concentrations typically require a higher proton dose to attain the same resistivity level.

In general, the resistivity of proton bombarded material is highly stable. However, as shown herein, a subsequent heat treatment may reduce the resistivity to that of the unbombarded material (or nearly so). In addition, the degree to which the resistivity recovers is dependent upon the dopant incorporated in the material and upon the annealing conditions, particularly the annealing temperature. FIG. 1 herein shows this characteristic schematically. Two essentially identical materials are doped differently: one with dopant A, the other with dopant B, but both are doped to comparable carrier concentration levels. As a result of ion bombardment, the resistivity of the materials increases from $R_1$ to $R_2$. When subjected to a controlled heat treatment (e.g., annealing for a suitable set of temperature/time conditions and in suitable ambient to prevent decomposition), the resistivity of the materials remains relatively constant (solid line segments I) over a broad range of temperatures (e.g., 0°–400° C.) but may increase (dashed line segments II) as a certain threshold temperature is approached. Importantly, however, the resistivity of the material with dopant A decreases abruptly at or near a threshold temperature $T_A$, whereas the resistivity of the material with dopant B decreases abruptly at or near a higher threshold temperature $T_B > T_A$. In accordance with our invention, therefore, simultaneously annealing the two ion-bombarded materials in a single structure (e.g., device, IC) at a temperature $T_a$ ($T_A \leq T_a \leq T_B$) returns the material doped with A to a low resistivity state while the material doped with B remains highly resistive.

In the AlGaAs materials system we have discovered that a group of the p-type dopants, Zn, Mg and Ge, have threshold annealing temperatures which are related as $T_{Zn} < T_{Mg} < T_{Ge}$. Some of the results supporting this conclusion are shown in FIG. 2, a table showing how the ratio of resistivity, before and after annealing, changed with annealing temperature. The samples were bombarded with 300 keV protons at a dose of $3 \times 10^{15}/cm^2$. Heating occurred at temperatures ranging from 450° C. to 700° C. in an open-tube, leaky box, diffusion-type furnace in a forming gas ambient for 30 minutes (estimated time at maximum temperature being 15 minutes). Depending upon the particular temperature, annealing for shorter or longer times would also be effective. In this table, samples 1, 4 and 5 were $Al_{0.40}Ga_{0.60}As$, samples 2, 3, 7 and 9 were GaAs, sample 6 was $Al_{0.30}Ga_{0.70}As$, and sample 8 was $GaAs_{0.99}Sb_{0.01}$. In summary, GaAs:Zn returned to its original resistivity at $T_{Zn} \leq 570°$ C.; GaAs:Ge and AlGaAs:Ge did not recover to better than a factor of five of their original conductivities even at temperatures as high as 700° C. (therefore, $T_{Ge} > 700°$ C.); and AlGaAs:Mg recovered at $T_{Mg} \leq 570°$ C. but GaAs:Mg acted like the Ge cases.

As a demonstration of how this phenomenon can be utilized to fabricate a structure having a buried resistive region, we used liquid phase epitaxy to grow the following layers, in the order recited, on a (100)-oriented n-GaAs:Si substrate: a 3–4 μm thick n-GaAs:Te buffer layer; an 0.2 μm thick p-$Al_{0.08}Ga_{0.92}As$:Mg layer; an 0.6 μm thick p-$Al_{0.40}Ga_{0.60}As$:Ge layer; an 0.6 μm thick p-$Al_{0.40}Ga_{0.60}As$:Mg layer; and an 0.15 μm thick heavily doped p-GaAs:Ge layer. A proton bombardment wire mask was used over the right hand third of the top surface while that surface was exposed to 300 keV protons at a dose of $3 \times 10^{15}/cm^2$, resulting in damage to a depth of about 2.8 μm. That is, the damage and high resistivity extended from the bombarded surface into the buffer layer. Then, the structure was annealed at $T_a = 570°$ C. for 15 minutes. Cleaving and staining the structure showed that the unbombarded (masked part of the structure) was dark and thus had high conductivity. In contrast, the bombarded portion of the structure exhibited alternating dark and light zones—the light zones were the Ge-doped AlGaAs layers which remained highly resistive because $T_a < T_{Ge} \geq 700°$ C., whereas the dark zones were the Mg-doped layers which returned to high conductivity because $T_a > T_{Mg} \leq 570°$ C. for AlGaAs. An SEM micrograph of this structure vividly depicted the light colored, bombarded portion of the 0.6 μm thick $Al_{0.40}Ga_{0.60}As$:Ge layer buried in dark colored high conductivity material.

Figure 3:
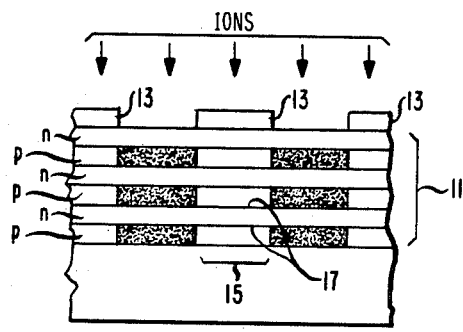
FIG. 3 is a schematic showing how, after annealing, an ion bombarded, multi-layered structure results in selected n-type layers becoming conductive and selected p-type layers remaining highly resistive.

A similar phenomenon exists for deuteron bombarded n-type GaAs as described by K. Steeples et al, *IEEE Electron Device Letters*, Vol. EDL-1, No. 5, p. 72 (1980). Although, their data does not show complete recovery of the original resistivity, our experiments indicate that such should occur. FIG. 3 of that paper shows the resistivity variation with annealing temperature for Te, Se, Si, Ge, Sn and S in GaAs. Note, for a 30 minute anneal the threshold temperature of Si is about 300°–350° C., that of Te and Se is about 350°–400° C., that of S is about 550°–600° C., and that of Ge and Sn is about 450°–500° C. Moreover, it is expected that this phenomenon also exists in other Group III-V compounds, such as InP/InGaAsP, which can be rendered highly resistive by helium ion or deuteron bombardment as described in the concurrently filed application of F. Capasso et al (Case 11-3-2-41), supra, which is incorporated by reference herein.

As a consequence, in a multilayered structure containing layers doped with different dopants, appropriate choice of the annealing temperature enables selected bombarded layers to remain highly resistive, whereas other bombarded layers return to low resistivity or high conductivity. Further selectivity can be attained by appropriate choice of the energy of the protons.

In accordance with our invention, therefore, a structure of the type shown in FIG. 3, which includes alternating layers 11 of n-type and p-type GaAs, is ion bombarded at an energy and dose so that the layers become highly resistive. The p-type dopant may be Ge so that $T_{Ge} \geq 700°$ C. and the n-type dopant may be Te so that $T_{Te} \sim 350°–400°$ C. Thus, when this structure is annealed at $T_a \sim 500°$ C., the n-type GaAs:Te layers become lowly resistive (or highly conductive) whereas the p-type GaAs:Ge layers remain highly resistive. Moreover, a patterned mask 13 may be used to form device channels 15, including p-n junctions 17, which are integrally connected to the highly conductive n-type layers. In this fashion, the n-type GaAs:Te layers may be utilized as a buried semiconductor interconnections or buried semiconductor bus bars which connect separated devices of an integrated circuit. Conversely, the p-type layers may be AlGaAs:Mg so that $T_{Mg} \leq 570°$ C., and the n-type layers may be GaAs:Te or Se so that $T_{Te} = T_{Se} \sim 350°–400°$ C. Again, annealing at $T_a \sim 500°$ C. will cause only the n-type layers to recover their original resistivity. In this fashion a structure similar to that of FIG. 3, but with AlGaAs/GaAs p-n heterojunctions can be realized.

Figure 4:
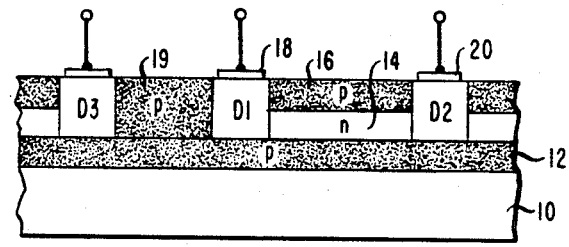
FIG. 4 is a schematic of an integrated circuit using a n-type layer as a buried interconnection in accordance with one embodiment of our invention.

One embodiment of our invention utilizing a buried semiconductor interconnection is shown schematically in FIG. 4. This integrated circuit includes a substrate 10 on which is formed a highly resistive p-GaAs layer 12. A set of devices D1, D2 and D3 are formed on the layer 12 by any suitable fabrication technique well known in the art. The devices may be identical to one another (e.g., transistor memory cells) or they may be different from one another (e.g., a laser and an FET driver in an optical integrated circuit). The devices D1 and D3 are electrically isolated from one another by a high resistivity p-type layer 19, whereas D1 and D2 are electrically connected to one another via a highly conductive n-

GaAs layer 14. A highly resistive p-GaAs layer 16 is formed on top of layer 14 and preferably is grown to a thickness which renders the top surface of the overall structure planar. Thus, the devices D1, D2 and D3 are partially embedded in the semiconductor body formed by layers 12, 14, 16 and 19. Of course, these devices could by fully embedded depending on the particular application. The high resistivity of the p-GaAs layers 12 and 16 is effective to electrically isolate the devices D1 and D2 from one another except for the conductive path provided by the high conductivity layer 14. Electrical signals are communicated between the devices D1 and D2 through the layer 14 which, therefore, serves as a buried interconnection. Contacts 18 and 20 on the top of devices D1 and D2, respectively, permit interconnection to the outside world. However, three dimensional integration is also possible and would permit contacts 18 and 20 to be positioned on the sides or other locations of the structure.

The portion of the structure of FIG. 4 associated with D1 and D2 may be fabricated in accordance with the following illustrative sequence of process steps. Using a well-known epitaxial growth technique (such as LPE, MBE or CVD), three epitaxial layers 12, 14, and 16 of p-GaAs:Ge, n-GeAs:Te and p-GaAs:Ge, respectively, are grown on a single crystal substrate 10. Alternatively, these layers may be formed by localized ion implantation and/or diffusion. The three layers are then subjected to one or more proton bombardments at a dose of approximately $10^{15}/cm^2$, thereby rendering the layers highly resistive (e.g., $10^5$–$10^9$ ohm-cm). Depending upon the thickness of the layers 12, 14, and 16, it may be desirable to utilize multiple proton bombardments at different energies in order to render highly resistive the layers (e.g., 12 and 16) which are at different depths. Moreover, in the event that the device is so thick that layer 12 cannot be reached by protons at the highest energy available from the implantation machine, then it is possible to bombard layer 12 prior to growing layers 14 and 16. This procedure may not be preferred, however, because it complicates the processing sequence, and also because epitaxial growth on the bombarded surface of layer 12 may be difficult. After the three layers have been proton bombarded so that all of the layers are highly resistive, they are then subjected to a controlled heat treatment which causes n-GaAs:Te layer 14 to return to low resistivity (or high conductivity) while the p-GaAs:Ge layers 12 and 16 remain highly resistive. A suitable heat treatment includes annealing the structure at $T_a \sim 500°$ C. for 15 minutes in an atmosphere of forming gas. Then, the devices D1 and D2 are formed. The fabrication of these devices may entail standard processing techniques such as the etching of a channel through layers 14 and 16 and subsequent epitaxial regrowth of layers (not shown) which constitute each of the devices. Illustratively, the layers grown in such a channel would form suitable p-n junctions depending upon the specific device design. Alternatively, the devices D1 and D2 may be formed in layers 14 and 16 by suitable masking of the device regions from proton bombardment and subsequent diffusion or implantation of dopants therein. Of course, a combination of these techniques may also be used. Although each of the devices D1 and D2 is shown schematically as occupying the area of a rectangle, the precise geometry depends upon both the processing technique utilized and the device design. Thus, for example, the devices may be formed in V-grooves which can be etched in Group III-V compound semiconductors as is well known in the art. In a similar fashion, the portion of the structure associated with devices D1 and D3 may be fabricated.

Figure 5:
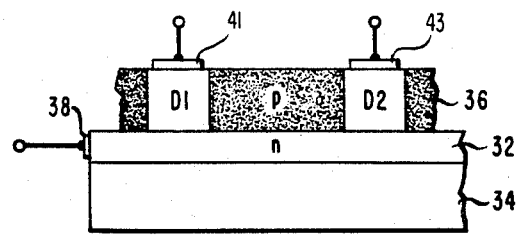
FIG. 5 is a schematic of an integrated circuit using an n-type layer as a buried bus bar in accordance with another embodiment of our invention.

An alternative embodiment of our invention is depicted in FIG. 5 which demonstrates how a buried semiconductor bus bar may be utilized to interconnect the devices in an array (e.g., a semiconductor memory). A highly conductive n-GaAs layer 32 is epitaxially grown on a single crystal substrate 34 (e.g., on a semi-insulating Cr-doped GaAs substrate). A pair of devices D1 and D2 are formed on layer 32 and are isolated from one another by a highly resistive proton bombarded p-GaAs layer 36. Thus, devices D1 and D2 are once again at least partially embedded in the semiconductor body formed by layers 32 and 36, and the thicknesses of the devices and layer 36 are adapted to produce a planar structure. As in a semiconductor memory, device D1 would be selectively operated by applying a suitable electrical signal between contact 38 on layer 32, which serves as a bus bar, and contact 41 on the top of device D1. In a similar fashion, device D2 would be selectively operated by applying a signal between contact 38 and contact 43.

The structure of FIG. 5 may be fabricated by the following illustrative sequence of processing steps. Layers 32 and 36 are epitaxially grown on a semi-insulating single crystal substrate 34 of GaAs, layer 32 being n-GaAs:Te and layer 34 being p-GaAs:Ge. The n-GaAs layer 36 is then subjected to one or more proton bombardments at a dose of about $10^{15}/cm^2$, thereby rendering both layer 31 and 36 highly resistive (e.g., $10^5$–$10^9$ ohms-cm). The energies of the bombardments are chosen so as to create high resistivity throughout the thickness of layer 36.

A controlled heat treatment, including annealing at 500° C. as described in conjunction with FIG. 4, renders the n-GaAs:Te layer 32 lowly resistive (or highly conductive), but the p-GaAs:Ge layer 36 remains highly resistive. After the proton bombardment step is completed, the devices D1 and D2 are formed in layer 36 by any of the techniques described with reference to FIG. 3.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In particular, the structures of FIGS. 4 and 5 may involve different processing sequences such that the devices D1 and D2 are formed before the proton bombardment of layers 14 and 16 of FIG. 4 or the proton bombardment of layers 32 and 36 of FIG. 5. In such cases, it may be desirable to suitably mask the top surfaces of the devices D1 and D2 in the event that the proton bombardment might adversely affect the characteristics or performance of the devices. Moreover, these structures can be realized using properly selected dopants in only n-type layers, only p-type layers, or combinations of the two.

Figure 6:
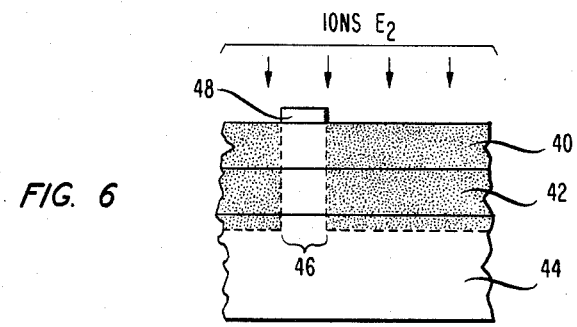
FIGS. 6–8 are schematics showing how buried conductive paths at different levels can be built into a semiconductor structure in accordance with still another embodiment of our invention.
Figure 7:
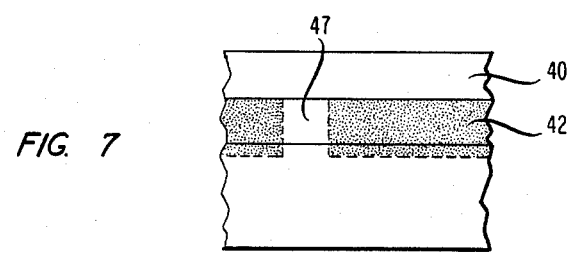
Figure 8:
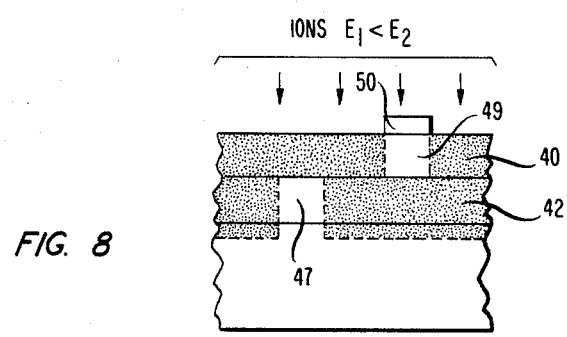

In addition, buried conductive paths at different levels in a semiconductor structure can be fabricated by a combination of ion bombardment and dopant-dependent selective annealing. With reference to FIG. 6, two differently doped layers 40 and 42 are formed on a substrate 44. These layers are masked and ion bombarded at an energy $E_2$ so that high resistivity is created in both layers (and may even extend into substrate 44) except in the region 46 under mask 48. Layers 40 and 42 are doped so that they have different threshold temperatures for annealing out bombardment-induced high resistivity. In particular, the resistivity of layer 40 anneals out at a temperature $T_{40}$ but the resistivity layer 42 anneals out a higher temperature $T_{42} > T_{40}$. Thus, as shown in FIG. 7, annealing the structure at a temperature $T_{40} < T_a < T_{42}$ causes layer 40 to return to a low resistivity (or high conductivity) condition, while layer 42 remains highly resistive except for the conductive path 47. Next, as shown in FIG. 8, the structure is masked at a different location and bombarded with ions having a lower energy $E_1 < E_2$ or with heavier ions which have a shallower penetration. Consequently, layer 40 is again rendered highly resistive except for the region under mask 50. The latter region forms a second conductive path 49 which is vertically and horizontally displaced from conductive path 47. These paths extend along the layer (i.e., into the page) and may serve to interconnect devices of an integrated circuit. Moreover, because the paths are in different planes, they need not be strictly parallel to one another; i.e., they may overlap and need not follow straight lines.

What is claimed is:

1. A method of manufacturing a device comprising the steps of
   (a) providing a multi-layered Group III-V compound structure which includes a first layer having a first dopant and a second layer having a second dopant,
   (b) ion bombarding said layers at a dose and energy so that said layers become highly resistive, the resistivity of said first layer remaining high when heated to a first temperature and thereafter decreasing to a relatively low resistivity, and the resistivity of said second layer remaining high when heated to a second temperature, different from said first temperature, and thereafter decreasing to a relatively low resistivity, and
   (c) simultaneously heating said layers at a temperature between said first and second temperatures so that one of said layers becomes lowly resistive while the other of said layers remains highly resistive.

2. The method of claim 1 including, between steps (a) and (b), the additional step (a1) of forming a patterned mask on a surface of said structure, and wherein said ion bombarding step (b) takes place through the openings of said mask.

3. The method of claim 1 wherein step (b) includes bombarding said layers with ions selected from the group consisting of protons, deuterons and helium ions.

4. The method of claim 1 wherein said first dopant is a donor and second dopant is an acceptor.

5. The method of claim 1 wherein said first and second dopants are acceptors.

6. The method of claim 1 wherein said first and second dopants are donors.

7. The method of claim 2 wherein
   step (a) provides a structure in which said second layer is formed above said first layer, and said dopants are effective to make said second temperature higher than said first temperature and to render said layers initially highly conductive,
   step (b) includes first bombarding said structure at one energy so that ions penetrate both of said layers and second bombarding said structure at a lower energy so that ions penetrate essentially only said second layer,
   step (a1) blocks ions from bombarding a first zone of said layers during said first bombarding step and blocks a second zone of said layers during said second bombarding step, and
   step (c) takes place between said first and second bombarding steps so that second layer is rendered at least lowly resistive prior to the formation of said second zone, thereby forming said zones into relatively conductive channels at least partially embedded in higher resistivity material.

8. The method of claim 7 wherein said steps are mutually adapted to position said zones at horizontally and vertically different locations in the cross section of said device.

9. A method of manufacturing an integrated circuit comprising the steps of
   (a) providing a multi-layered Group III-V compound structure which includes a first layer having a first dopant and a second layer having a second dopant,
   (b) ion bombarding said layers at a dose and energy so that said layers become highly resistive, the resistivity of said first layer remaining high when heated to a first temperature and thereafter decreasing to a relatively low resistivity, and the resistivity of said second layer remaining high when heated to a second temperature, different from said first temperature, and thereafter decreasing to a relatively low resistivity,
   (c) simultaneously heating said layers at a temperature between said first and second temperatures so that one of said layers becomes lowly resistive while the other of said layers remains highly resistive, and
   (d) forming at least two separated devices in said structure so that said highly resistive layer electrically isolates said devices from one another and said lowly resistive layer forms a conductive path between said devices.

10. The method of claim 9 wherein
step (a) includes providing a structure comprising an n-type layer sandwiched between a pair of p-type layers,
step (b) renders all of said layers highly resistive,
step (c) renders said n-type layer lowly resistive but said p-type layers remain highly resistive, and
step (d) at least partially embeds said devices in said layers so that said pair of p-type layers bound said n-type layer which forms said conductive path between said devices.

11. The method of claim 9 wherein
step (a) includes providing a structure comprising an n-type layer formed on a p-type layer,
step (b) renders both of said layers highly resistive,
step (c) renders said n-type layer lowly resistive but said p-type layer remains highly resistive, and
step (c) at least partially embeds said devices in said p-type layer and said n-type layer forms a buried bus bar connecting said devices to one another.

* * * * *